United States Patent
Hino et al.

(10) Patent No.: US 9,627,350 B2
(45) Date of Patent: Apr. 18, 2017

(54) METHOD FOR MANUFACTURING SEMICONDUCTOR DEVICE

(71) Applicant: Mitsubishi Electric Corporation, Tokyo (JP)

(72) Inventors: Yasunari Hino, Tokyo (JP); Daisuke Kawabata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/959,139

(22) Filed: Dec. 4, 2015

(65) Prior Publication Data
US 2016/0322327 A1 Nov. 3, 2016

(30) Foreign Application Priority Data
Apr. 30, 2015 (JP) .................. 2015-092616

(51) Int. Cl.
*H01L 21/00* (2006.01)
*H01L 23/00* (2006.01)
(52) U.S. Cl.
CPC .............. *H01L 24/83* (2013.01); *H01L 24/27* (2013.01); *H01L 2224/2711* (2013.01); *H01L 2224/27505* (2013.01); *H01L 2224/2969* (2013.01); *H01L 2224/29139* (2013.01); *H01L 2224/29147* (2013.01); *H01L 2224/32054* (2013.01); *H01L 2224/32225* (2013.01); *H01L 2224/48137* (2013.01); *H01L 2224/48472* (2013.01); *H01L 2224/73265* (2013.01)

(58) Field of Classification Search
None
See application file for complete search history.

(56) References Cited

U.S. PATENT DOCUMENTS

| 2008/0315401 | A1 | 12/2008 | Imamura et al. | |
| 2010/0330745 | A1* | 12/2010 | Oikawa | C09J 5/06 438/118 |
| 2014/0120356 | A1* | 5/2014 | Shearer | C09J 11/02 428/457 |
| 2014/0138710 | A1* | 5/2014 | Ohtsu | H01L 24/89 257/77 |

FOREIGN PATENT DOCUMENTS

JP 2009-004666 1/2009

* cited by examiner

*Primary Examiner* — Calvin Choi
(74) *Attorney, Agent, or Firm* — Studebaker & Brackett PC

(57) ABSTRACT

A method for manufacturing a semiconductor device according to the present invention includes: (a) disposing, on a substrate (insulating substrate), a bonding material having a sheet shape and having sinterability; (b) disposing a semiconductor element on the bonding material after the (a); and (c) sintering the bonding material while applying pressure to the bonding material between the substrate and the semiconductor element. The bonding material includes particles of Ag or Cu, and the particles are coated with an organic film.

7 Claims, 5 Drawing Sheets

METHOD FOR MANUFACTURING SEMICONDUCTOR DEVICE

BACKGROUND OF THE INVENTION

Field of the Invention

The present invention relates to a method for manufacturing a semiconductor device, and more particularly, to a method for bonding a substrate and a semiconductor element in a semiconductor device.

Description of the Background Art

In recent times, high-efficiency and energy-saving semiconductor devices with consideration for environmental problems grow in demand due to increasing environmental controls. The semiconductor devices are used for industrial equipment, drive control equipment of household electrical appliances including motors, vehicle-mounted control equipment for electric-powered vehicles and hybrid vehicles, railroad control equipment, and control equipment for solar-electric power generation, for example. The semiconductor devices need to be suitable for high electric power.

Particularly for the vehicle-mounted control equipment and the railroad control equipment, the semiconductor devices can be used under heavy load conditions (under high temperature conditions) from the viewpoint of saving energy and suppressing electrical-energy conversion losses. In other words, high-efficiency and low-loss operations are needed under the high temperature conditions. Specifically, normal operating temperatures (junction temperatures) have been 125° C. to 150° C., but operations under high temperature conditions at 175° C. to 200° C. or higher will be required.

Thus, materials for semiconductor modules and structures thereof need to be reconsidered to suppress switching losses reduce losses, and increase efficiency under the high temperature conditions. Wiring connected portions (bonding portions) in the semiconductor devices in particular deteriorate most easily, and achieving high quality, high reliability, and extended lifetime of the wiring connected portions is a great challenge. Moreover, costs of expensive materials having sinterability need to be reduced.

Bonding materials having sinterability have recently been developed, but the application to products makes it difficult to suppress the costs and maintain quality and reliability of bonding.

Conventional bonding materials having the sinterability, which are paste, are screen-printed with masks or applied with syringes. Thus, the bonding materials do not have a uniform thickness, and irregularities are formed on a surface of the bonding materials.

The bonding materials having the sinterability are more expensive than solder materials. For example, when a bonding material is disposed by screen printing, part of the bonding material goes to waste.

When the bonding material is extruded from a bonding surface to which a semiconductor element is bonded, pressure fails to be applied to part of the bonding material during sintering, so that a sintered material to which pressure is not applied may fall off after sintering.

After a pasty bonding material is conventionally disposed and dried, the semiconductor element is disposed on the bonding material. Thus, the semiconductor element may sometimes be damaged when the semiconductor element is disposed, and the semiconductor element may sometimes be misaligned in subsequent steps.

SUMMARY OF THE INVENTION

It is an object of the present invention to provide a method for manufacturing a semiconductor device that suppresses an increase in costs of a bonding material having sinterability and performs high-quality bonding.

A method for manufacturing a semiconductor device according to the present invention includes: (a) disposing, on a substrate, a bonding material having a sheet shape and having sinterability; (b) disposing a semiconductor element on the bonding material after the (a); and (c) sintering the bonding material while applying pressure to the bonding material between the substrate and the semiconductor element. In the present invention, the bonding material includes particles of Ag or Cu, and the particles are coated with an organic film.

In the method for manufacturing a semiconductor device according to the present invention, the bonding material has the sinterability and includes the particles of Ag or Cu, the particles being coated with the organic film. Therefore, the bonding material is applicable to bonding of the semiconductor device suitable for high temperature operations. This allows the semiconductor device to obtain high quality and high reliability. The bonding material having the sheet shape is used, which suppresses irregularities on the surface of the bonding material. This improves quality of bonding at the bonding portions. Using a necessary amount of the bonding material cut out from a large bonding material having the sheet shape eliminates the waste of the bonding material, and the manufacturing costs can thus be reduced.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

<Configuration>

Figure 1:
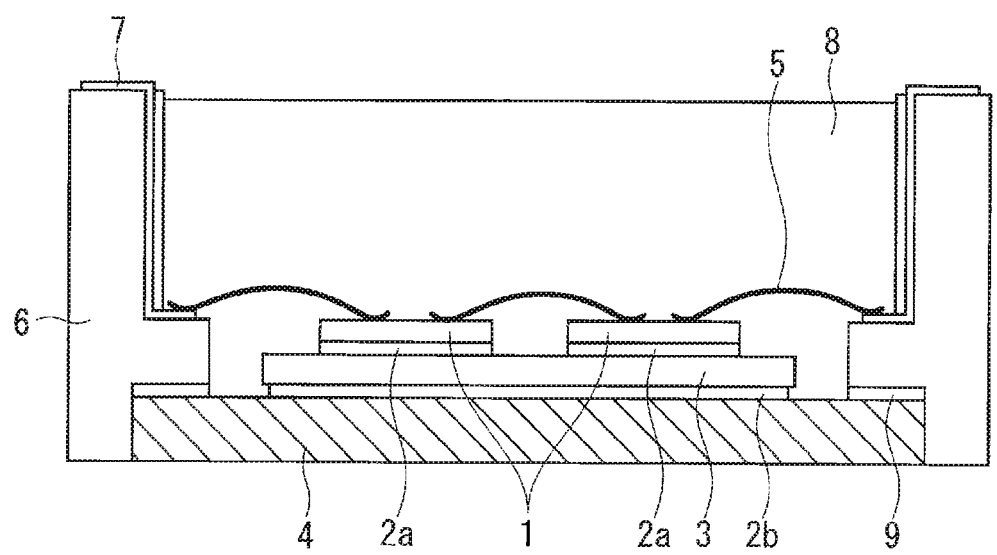
FIG. 1 is a cross-sectional view of a semiconductor device in a first preferred embodiment.

FIG. 1 is a cross-sectional view of a semiconductor device in a first preferred embodiment. The semiconductor device in this preferred embodiment is a semiconductor element device that is used under high temperature conditions and can operate at high temperature. High temperature herein refers to 175° C. to 200° C. or higher, for example.

The semiconductor device in the first preferred embodiment includes an insulating substrate 3 being a substrate having insulation performance, semiconductor elements 1 bonded to the insulating substrate 3, and a bonding material 2a having sinterability that bonds the insulating substrate 3 and the semiconductor elements 1. A circuit pattern is formed on a surface of the insulating substrate 3. The circuit pattern is bonded to back surface electrodes of the semiconductor elements 1 with the bonding material 2a having the sinterability.

A surface of the insulating substrate 3 opposite to the semiconductor elements 1 is bonded to a radiating plate 4 with a bonding material 2b therebetween. The bonding material 2b herein is a bonding material having sinterability or a solder material resistant to high temperature.

The radiating plate 4 and a case 6 are bonded with an adhesive 9. The case 6 defines the outline of the semiconductor device. In other words, the case 6 surrounds the insulating substrate 3, the semiconductor elements 1, and wires 5. The case 6 made of resin is integrally molded with an electrode 7. Upper surface electrodes of the semiconductor elements 1 and the electrode 7 are connected with the wires 5. A control substrate on which a drive circuit or a protective circuit is installed may be located inside the case 6, which is not shown in FIG. 1.

Further, the case 6 is filled with a sealing material 8, to thereby seal the insulating substrate 3, the semiconductor elements 1, and the wires 5.

Hereinafter, each of the structural components is described in detail. The dimensions of the structural components described below are illustrative and are not limited to the dimensions as described.

The radiating plate 4 has a length of a side of 30 mm to 300 mm and has a thickness of 3 mm to 5 mm. The radiating plate 4 is made of Cu, Al, or Al—SiC complex and has a high heat capacity. The bonding material 2b that bonds the radiating plate 4 and the insulating substrate 3 is a bonding material having sinterability and a thickness of approximately 20 to 100 μm or a solder bonding material having a thickness of approximately 100 to 300 μm.

The insulating substrate 3 has a thickness of 0.2 mm to 3 mm. The insulating substrate 3 has a uniform thickness. Materials for the insulating substrate 3 include $Si_3N_4$, AlN, $Al_2O_3$, or $ZrAl_2O_3$.

The semiconductor elements 1 are power semiconductor elements, for example, and are semiconductor elements such as IGBTs, MOSFETs, and diodes that handle high electric power. The semiconductor elements 1 form a three-phase circuit suitable for AC outputs. The semiconductor elements 1 are not limited to the IGBTs, the MOSFETs, and the diodes that are made of Si, and the semiconductor elements 1 may be made of SiC or GaN. For example, when the semiconductor elements 1 are the IGBTs, the back surface electrodes on the bottom surfaces of the semiconductor elements 1 are collector electrodes, and the upper surface electrodes on the surfaces of the semiconductor elements 1 are emitter electrodes and gate electrodes.

In the case where the semiconductor elements 1 form the three-phase circuit, the semiconductor elements 1 (diodes, IGBTs, or MOSFETs, for example) include each phase wire-bonded to the circuit pattern on the insulating substrate 3 with the wires 5 of aluminum and wire-connected in an electronic equipment.

The upper surface electrode (emitter electrode) of at least one of the semiconductor elements 1 (IGBT, for example) is connected to an electrode of another one of the semiconductor elements 1 (diode, for example) adjacent to the at least one semiconductor element 1 with the wire 5. Part of the electrode 7 is connected to an electric motor, a battery, or a harness outside the case 6.

The case 6 is made of polyphenylene sulfide (PPS) resin, polybutylene terephthalate (PBT) resin, or epoxy resin, for example. The electrode 7 is an AC output terminal that receives an input from the outside and produces an output to the outside, an input-output terminal, and a signal terminal that performs controls. The electrode 7 is made of copper or an alloy of copper having a thickness of approximately 1 mm. The electrode 7 is integrally molded with the case 6.

In the case where the control substrate is installed inside the case 6, part of the electrode 7 is connected to the control substrate on which the drive circuit or the protective circuit is installed, which is not shown in FIG. 1. The electrode 7 receives an input of a control signal for switching. The control substrate is supported by the electrode 7 and is located over the insulating substrate 3 almost in parallel to the insulating substrate 3.

The sealing material 8 is a Si-based insulating gel material or epoxy resin. When the sealing material 8 includes the gel material, an opening of the case 6 is closed with a lid (not shown) with an adhesive therebetween.

The bonding material 2a has the same area as that of a bonding surface to be subjected to bonding of the semiconductor element 1. In the first preferred embodiment, the bonding surface to be subjected to bonding of the semiconductor element 1 is the bottom surface of the semiconductor element 1. Specifically, for example, the semiconductor element 1 has a side of the bottom surface of 4 mm to 18 mm whose length is the same as a length of each side of the bonding material 2a.

Figure 3:
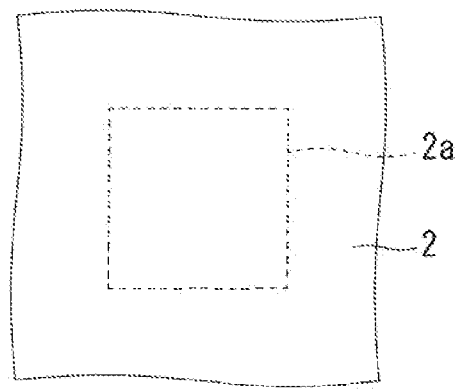
FIG. 3 is a diagram for describing a cut-out of a bonding material having a sheet shape.

As shown in FIG. 3, the bonding material 2a has a sheet shape. The bonding material 2a has a thickness in a range of 40 μm to 200 μm. The bonding material 2a has a uniform thickness. Unlike the conventional pasty bonding material, any part of the bonding material 2a is not extruded from the bonding surfaces to which the semiconductor elements 1 are bonded as shown in FIG. 1. This eliminates the possibility that part of the extruded bonding material falls off and a short occurs inside the case 6.

The bonding material 2a after sintering has a thickness of approximately 20 μm to 100 μm at the bonding portions between the semiconductor elements 1 and the insulating substrate 3. To secure reliability of the bonding portions, solder needs to have a thickness of 1000 μm or more in solder bonding. On the other hand, using the bonding material 2a having the sinterability and a thickness of 100 μm or less does not affect the reliability. The bonding material 2a has a thermal conductivity higher than that of solder, thereby also having preferable heat dissipation characteristics (100 to 250 W/m·K).

The bonding material 2a has the sheet shape and includes metal nanoparticles, a solvent, and a surface stabilizer. The metal nanoparticles are Ag, Cu, Au, Pd, Pt, or the like having a diameter of 1 nm or more. The metal nanoparticles have surfaces coated with an organic protective film. The bonding material 2a include the metal nanoparticles or metal microparticles, so that melting point depression occurs, and sinter-bonding can be performed at a temperature lower than the inherent melting temperature of the bonding material. After bonding, the melting point rises similarly to bulk materials, and thus high heat resistance and high reliability are obtained.

In a case where the bonding material 2a includes the metal nanoparticles of Ag, pressure is applied to the bonding material 2a between the semiconductor elements 1 and the insulating substrate 3 while heating the bonding material 2a at 180° C. to 350° C. After bonding, the bonding material 2a obtains heat resistance to around 900° C. Therefore, the bonding material 2a is applicable to the semiconductor device that operates at high temperature.

<Manufacturing Method>

Figure 2:
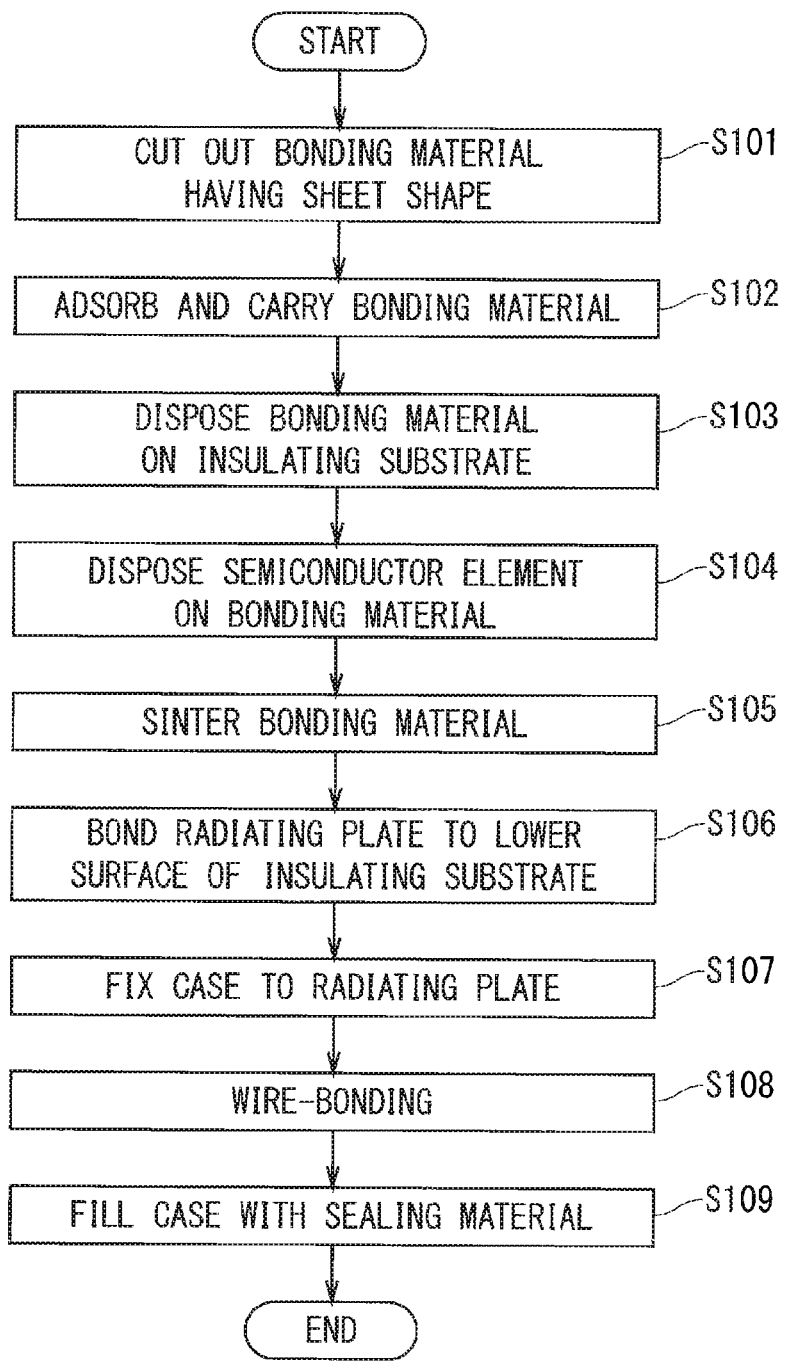
FIG. 2 is a flow chart showing a method for manufacturing the semiconductor device in the first preferred embodiment.
Figure 4:
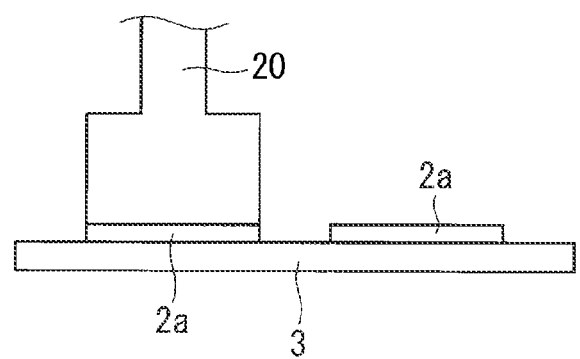
FIG. 4 is a diagram for describing a layout of the bonding material on an insulating substrate.

FIG. 2 is a flow chart showing a method for manufacturing the semiconductor device in the first preferred embodiment. First, as shown in FIG. 3, the bonding material 2a is cut out from a large bonding material 2 having a sheet shape and sinterability (Step S101). Herein, the bonding material 2a cut out has the same area as that of the surface (bottom surface) to be subjected to bonding of the semiconductor elements 1. An adsorptive collet 20 shown in FIG. 4 is used to cut out the bonding material 2a. Herein, a bottom surface (adsorption surface) of the adsorptive collet 20 has the same area as that of the bonding material 2a cut out. First, the adsorptive collet 20 that has been heated is pressed against an original bonding material 2 having the sheet shape and the sinterability. The original bonding material 2 having the sheet shape and the sinterability has tackiness, so that the pressed region of the bonding material 2 having the sinterability is transferred to the adsorption surface of the adsorptive collet 20. The adsorptive collet 20 is then pulled up, and the bonding material 2 having the sinterability (namely, the bonding material 2a) that has been transferred to the adsorptive collet 20 is separated from the bonding material 2 having the sheet shape and the sinterability. After the adsorptive collet 20 cuts out the bonding material 2a, the adsorptive collet 20 continues to adsorb the bonding material 2a and carries it (Step S102). Then, as shown in FIG. 4, the bonding material 2a is disposed on the insulating substrate 3 (Step S103). The circuit pattern is formed on the insulating substrate 3, and the bonding material 2a is disposed on the circuit pattern, which is not shown in FIG. 4.

Figure 5A:
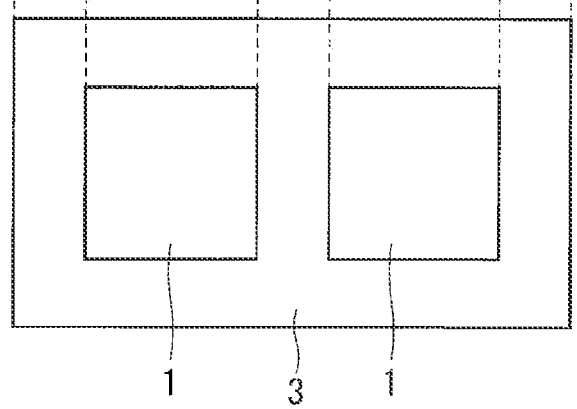
FIG. 5A and FIG. 5B are diagrams for describing a layout of semiconductor elements on the bonding material.
Figure 5B:
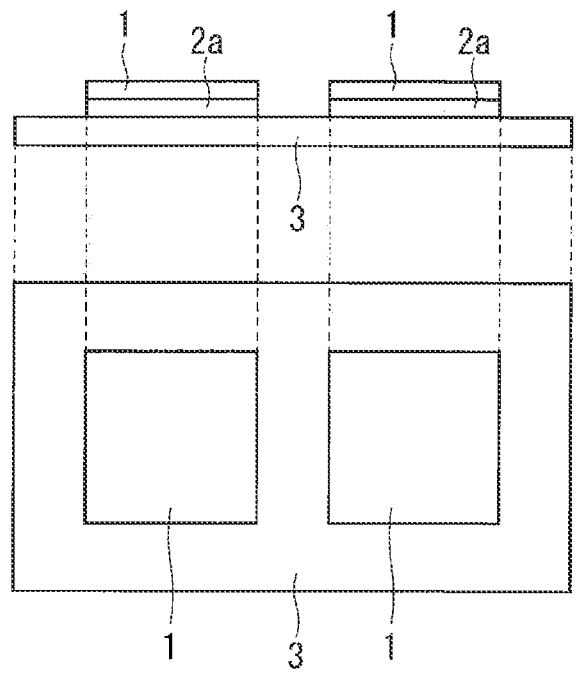

Next, the semiconductor elements 1 are disposed on the bonding material 2a (Step S104). FIG. 5A and FIG. 5B are respectively a cross-sectional view and a plan view of the semiconductor elements 1 disposed on the bonding material 2a. The semiconductor elements 1 are disposed so as to overlap the bonding material 2a in plan view. The semiconductor elements 1 and the bonding material 2a have the same area, so that the bonding material 2a is not extruded from the bonding surfaces. The bonding material 2a has tackiness, so that the semiconductor elements 1 are disposed on the bonding material 2a to be stuck to the bonding material 2a.

Then, the bonding material 2a is sintered (Step S105). While applying pressure to the bonding material 2a between the insulating substrate 3 and the bonding surfaces bonded to the mounted semiconductor elements 1, the bonding material 2a is sintered. A heating pressurizing device performs the heating process and the pressurizing process. A condition at heating temperatures in a range of 180° C. to 350° C. and at applied pressure in a range of 5 MPa to 30 MPa is kept for 10 to 180 seconds for bonding. The insulating substrate 3 and the semiconductor elements 1 are bonded with the bonding material 2a therebetween in the heating and pressurizing processes. The heating pressurizing device may collectively process a plurality of insulating substrates 3 in steps of the heating and pressurizing processes.

Next, the radiating plate 4 is bonded to the lower surface of the insulating substrate 3 (Step S106). The bonding is performed with solder resistant to high temperature or a bonding material of the same material as the bonding material 2a. In a case where the radiating plate 4 is bonded to the lower surface of the insulating substrate 3 with a bonding material having sinterability, the insulating substrate 3 is mounted on the radiating plate 4 with the bonding material having the sinterability therebetween at the time of bonding the semiconductor element 1 and the insulating substrate 3, and heating pressurizing equipment may simultaneously perform bonding. In other words, Step S105 and Step S106 may be simultaneously performed.

Next, the case 6 is fixed to the radiating plate 4 (Step S107). The fixing is performed with the adhesive 9, for example. Then, the wires connect between the upper surface electrodes of the semiconductor elements 1 or between the upper surface electrodes of the semiconductor elements 1 and the electrode 7 (Step S108). The wires are made of conductive materials such as Al and Cu. The wiring connection is performed by wire-bonding.

Lastly, the case 6 is filled with the sealing material 8 (Step S109). In other words, the insulating substrate 3, the semiconductor elements 1, the wires 5, and the control substrate (not shown) as necessary are sealed with the sealing material 8. After the steps described above, the semiconductor device in the first preferred embodiment is manufactured.

Figure 6:
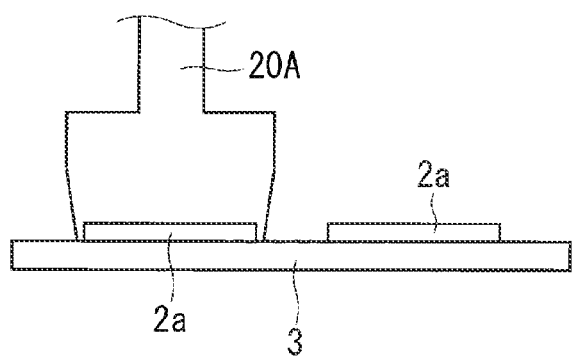
FIG. 6 is a diagram showing a modification of an adsorptive collet.

In the first preferred embodiment, the bonding material 2a is cut out by exploiting the tackiness of the bonding material 2 having the sheet shape and the sinterability, but the bonding material 2a may be cut out with a punching die. FIG. 6 is a diagram of an adsorptive collet 20A being a modification of the adsorptive collet 20 in FIG. 4. As shown in FIG. 6, a punching die is located on an adsorption surface of the adsorptive collet 20A. The portion of the punching die of the adsorptive collet 20A is pressed against the bonding material 2 having the sheet shape and the sinterability, and thus a bonding material 2 having the sinterability (namely, bonding material 2a) that corresponds to the region surrounded by the punching die is cut out from the bonding material 2 having the sheet shape and the sinterability.

<Effects>

The method for manufacturing a semiconductor device in the first preferred embodiment includes: (a) disposing, on the substrate (insulating substrate 3), the bonding material 2a having the sheet shape and having the sinterability; (b) disposing the semiconductor elements 1 on the bonding material 2a after the (a); and (c) sintering the bonding material 2a while applying pressure to the bonding material 2a between the substrate and the semiconductor elements 1. The bonding material 2a includes the particles of Ag or Cu, and the particles are coated with the organic film.

In the first preferred embodiment, the bonding material 2a is a bonding material having sinterability, and the bonding material 2a includes the particles of Ag or Cu, the particles being coated with the organic film. Therefore, the bonding material 2a is applicable to bonding of the semiconductor device suitable for high temperature operations. This allows the semiconductor device to obtain high quality and high reliability.

In the first preferred embodiment, the bonding material 2a having the sheet shape is half-dried and is thus easy on the semiconductor elements 1. The solvent is not sufficiently volatilized, so that the bonding material 2a having the sheet shape also has the tackiness. Thus, the semiconductor elements 1 are sufficiently bonded to the bonding material 2a and kept to be fixed when the semiconductor elements 1 are disposed on the bonding material 2a. Therefore, misalignment of the semiconductor elements 1 and damage to the semiconductor elements 1 are prevented in the step of sintering (applying heat and pressure to) the bonding material 2a.

The pasty bonding material has conventionally been screen-printed with masks or applied to substrates with syringes. Thus, the bonding material having a uniform thickness has hardly been disposed. In the first preferred embodiment, the bonding material having the sheet shape and having the uniform thickness is used, thereby suppressing irregularities on the surface of the bonding material. Using the bonding material having the sheet shape particularly solves dog-ears (projections on surface) being the challenge of screen printing. Thus, in the first preferred embodiment compared to the case in which the pasty bonding material is used, the quality of bonding at bonding portions is improved. Moreover, porous regions are prevented from occurring in the bonding material 2a, thereby improving the reliability of bonding.

When screen printing has conventionally been performed using the pasty bonding material more expensive than solder material, bonding materials more than necessary have been disposed on masks to secure a steady printing thickness, resulting in a waste of the excess bonding materials. The bonding materials remaining on a squeegee also have gone to waste. In the first preferred embodiment, the necessary amount of bonding material 2a is cut out from the large bonding material 2 having the sheet shape to be used. This eliminates the waste of the bonding material, and the manufacturing costs can thus be reduced. The first preferred embodiment compared to the case in which the pasty bonding material is used eliminates the need for the steps of printing and drying the bonding material, and investments in production equipment and production costs can thus be reduced.

In the method for manufacturing a semiconductor device in the first preferred embodiment, the bonding material 2a having the sheet shape and having the sinterability has the uniform thickness.

Therefore, in the first preferred embodiment compared to the case in which the pasty bonding material is used, the irregularities on the surface of the bonding material are suppressed. Using the bonding material having the sheet shape particularly solves the dog-ears (projections on surface) being the challenge of screen printing. Thus, the quality of bonding at the bonding portions is improved. The porous regions are prevented from occurring in the bonding material 2a, thereby improving the reliability of bonding.

In the method for manufacturing a semiconductor device in the first preferred embodiment, the substrate comprises the insulating substrate 3 containing SiN or AlN, and the insulating substrate 3 has the surface on the semiconductor elements 1 side on which the circuit pattern containing Cu is formed. Therefore, the insulating substrate having a high thermal conductivity and high insulation performance can be obtained.

The method for manufacturing a semiconductor device in the first preferred embodiment further includes the (d) cutting out the bonding material 2a from the original bonding material 2 having the sheet shape and having the sinterability before the (a), the bonding material 2a having the same size as that of the surface to be subjected to bonding of the semiconductor elements 1. The bonding material 2a cut out in the (d) is disposed on the substrate (insulating substrate 3) in the (a).

In a case where the pasty bonding material is printed and disposed as in the conventional manner, spread of printing occurs in screen printing or even in an application technique with a syringe, causing the applied area to be larger than an area of a semiconductor element. The bonding material extruded from the bonding surface is not pressurized, so that part of the bonding material may fall off and electrical abnormalities may occur in the manufacturing steps (of wire-bonding, bonding a radiating plate, fixing a case, injecting a sealing material, for example) after sintering. In the first preferred embodiment, the bonding material 2a having the same size as that of the bottom surface of the semiconductor element 1 is cut out from the large bonding material 2 having the sheet shape and is used for bonding. Thus, all portions of the bonding material 2a are pressurized, which can prevent part of the bonding material 2a from falling off after sintering.

In the method for manufacturing a semiconductor device in the first preferred embodiment, the bonding material 2a is cut out with the adsorptive collet 20 in the (d), and the bonding material 2a cut out with the adsorptive collet 20 is carried and disposed in the (a). The bonding material 2a cut out with the adsorptive collet 20 in the (d) has the same area as that of the surface to be subjected to bonding of the semiconductor elements 1.

Therefore, a series of the steps of cutting out, carrying, and disposing the bonding material 2a is performed using the adsorptive collet 20, which can increase production efficiency.

In the method for manufacturing a semiconductor device in the first preferred embodiment, the bonding material 2a has cushioning properties and the tackiness.

In the first preferred embodiment, the bonding material 2a having the sheet shape is half-dried and is thus easy on the semiconductor elements 1. The solvent is not sufficiently volatilized, so that the bonding material 2a having the sheet shape also has the tackiness. Thus, the semiconductor elements 1 are sufficiently bonded to the bonding material 2a and kept to be fixed when the semiconductor elements 1 are disposed on the bonding material 2a. Therefore, misalignment of the semiconductor elements 1 and damage to the semiconductor elements 1 are prevented in the step of sintering (applying heat and pressure to) the bonding material 2a.

Second Preferred Embodiment

<Configuration>

Figure 7:
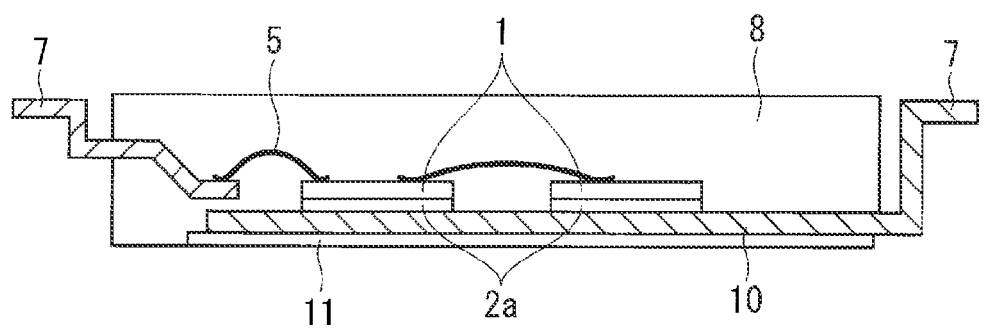
FIG. 7 is a cross-sectional view of a semiconductor device in a second preferred embodiment.

FIG. 7 is a cross-sectional view of a semiconductor device in a second preferred embodiment. The semiconductor device in the second preferred embodiment is a semiconductor element device that is used under high temperature conditions and can operate at high temperature, similarly to the first preferred embodiment.

The semiconductor device in the second preferred embodiment includes a conductive substrate 10, semiconductor elements 1 bonded to the conductive substrate 10, and a bonding material 2a having sinterability that bonds the conductive substrate 10 and the semiconductor elements 1. In addition, the conductive substrate 10 is a metal plate. The bonding material 2a in the second preferred embodiment is the same bonding material as that in the first preferred embodiment.

A back surface of the conductive substrate 10 (namely, a surface opposite to a surface bonded to the semiconductor elements 1) adheres to a metal insulating layer 11 including an insulating foil.

As shown in FIG. 7, the conductive substrate 10 has an end being an electrode 7. Another electrode 7 is connected to upper electrodes of the semiconductor elements 1 with wires 5.

The conductive substrate 10, the semiconductor elements 1, the bonding material 2a, the metal insulating layer 11, and the wires 5 are sealed with a sealing material 8 containing epoxy as a main component. A bottom surface of the metal insulating layer 11 and part of the electrodes 7 are exposed to the outside of the sealing material 8. The electrodes 7 are connected to an electric motor, a battery, a harness, or the like. Hereinafter, each of the structural components is described in detail.

In the semiconductor device in the second preferred embodiment, a pair of an IGBT and a diode as the semiconductor elements 1 are bonded to the conductive substrate 10. The IGBT as one of the semiconductor elements 1 includes a collector electrode as a back surface electrode and a gate electrode and an emitter electrode as upper surface electrodes. The IGBT receives an input (ON and OFF control) from the outside and is controlled from the outside by the electrodes 7. In addition, the semiconductor element 1, which is not limited to the IGBT, may be a MOSFET or a transistor. Further, a material for the MOSFET or the transistor, which is not limited to Si, may be SiC or GaN, for example. The upper surface electrodes and the back surface electrode of the semiconductor element 1 are coated with Ti—Ni—Au or Ag.

The back surface electrode (such as the collector electrode) of the semiconductor element 1 and the conductive substrate 10 are connected with the bonding material 2a. The conductive substrate 10 is a metal plate of copper or an alloy of copper having a high thermal conductivity of approximately 400 W/(m·K) and having a low electrical resistance of 2 $\mu\Omega$·cm. The conductive substrate 10 has a thickness of approximately 3 mm to 5 mm and functions as a radiating plate.

The conductive substrate 10 has the end that extends to the outside of the sealing material 8 and is the electrode 7. The metal insulating layer 11 adhering to the back surface of the conductive substrate 10 has a laminated structure of an insulating layer and a protective metal layer. Epoxy resin in which fillers such as boron nitride and alumina are mixed is used for the insulating layer. The insulating layer adheres to the protective metal layer made of copper or aluminum having a high thermal conductivity. The metal insulating layer 11 is connected to a radiating plate, a heat sink including a plurality of fins, and a water-cooled fin, which is not shown in FIG. 7.

Heat generated by the operations of the semiconductor elements 1 is transmitted to the bonding material 2a, the conductive substrate 10, and the metal insulating layer 11, and furthermore, the heat is radiated to the outside through, for example, the radiating plate (not shown) connected to the metal insulating layer 11. In this manner, a rise in the temperature of the semiconductor elements 1 is suppressed.

One of the upper surface electrodes (gate electrode) of one of the semiconductor elements 1 as the IGBT is connected to the electrode 7 with the wire 5. The other upper surface electrode (emitter electrode) of the semiconductor element 1 is connected, with the wire 5, to the upper electrodes of another one of the semiconductor elements 1 as the diode disposed adjacent to the semiconductor element 1 as the IGBT. The back surface electrode (collector electrode) of the semiconductor elements 1 are electrically connected to external terminals via the conductive substrate 10 and the electrode 7.

The electrodes 7 are formed by bending flat plates by die forming, the flat plates being made of copper or an alloy of copper and having a thickness of approximately 0.5 mm to 2 mm. The surfaces of the semiconductor elements 1 are typically solid-phase bonded to external electrodes by wire-bonding with the wires 5 of metal containing Al or Cu as a main component. The semiconductor device in the second preferred embodiment is assumed to control a large current by switching and to pass the large current as an operating current. Therefore, the plurality of wires 5 are disposed in parallel, and thick metal wires having a diameter of approximately 200 to 500 µm are used for the wires 5.

The bonding material 2a has the same area as that of a bonding surface to be subjected to bonding of the semiconductor elements 1. In the second preferred embodiment, the bonding surface to be subjected to bonding of the semiconductor element 1 is the bottom surface of the semiconductor element 1. Specifically, the semiconductor element 1 has a side of the bottom surface of 4 mm to 18 mm whose length is the same as a length of each side of the bonding material 2a.

<Manufacturing Method>

A method for manufacturing the semiconductor device in the second preferred embodiment includes the steps common to those in the first preferred embodiment, so that descriptions are given with reference to the flow chart of FIG. 2 used in the first preferred embodiment.

First, similarly to the first preferred embodiment, the bonding material 2a is cut out from a large bonding material 2 having the sheet shape and the sinterability (, which corresponds to Step S101 in FIG. 2). Herein, the bonding material 2a cut out has the same area as that of the surface (bottom surface) to be subjected to bonding of the semiconductor elements 1. A collet 20 is used to cut out the bonding material 2a. After the collet 20 cuts out the bonding material 2a, the collet 20 continues to adsorb, carries, and disposes the bonding material 2a on the conductive substrate 10 (, which corresponds to Step S102 and Step S103 in FIG. 2). In addition, a substrate in the first preferred embodiment is the insulating substrate 3, but a substrate in the second preferred embodiment is the conductive substrate 10. Then, the semiconductor elements 1 are disposed on the bonding material 2a (, which corresponds to Step S104 in FIG. 2).

Next, the bonding material 2a is sintered (, which corresponds to Step S105 in FIG. 2). Heating temperatures and applied pressure are similar to those in the first preferred embodiment. Then, the wires connect between the upper surface electrodes of the semiconductor elements 1 or between the upper surface electrodes of the semiconductor elements 1 and the electrode 7 (, which corresponds to Step S108 in FIG. 2).

Lastly, the conductive substrate 10, the semiconductor elements 1, the bonding material 2a, and the wires 5 are sealed with the sealing material 8 containing epoxy as a main component (, which corresponds to Step S109 in FIG. 2). The case 6 is filled with the sealing material 8 in the first preferred embodiment while the semiconductor device in the second preferred embodiment does not include the case 6 and performs sealing by transfer molding, for example. For sealing performed by the transfer molding, the metal insulating layer 11 is closely bonded to the bottom surface of the conductive substrate 10. Thus, the bonding portions in the semiconductor device are fixed with the sealing material 8, so that higher quality and higher reliability of the bonding portions are obtained.

<Effects>

In the method for manufacturing the semiconductor device in the second preferred embodiment, a substrate is the conductive substrate 10 containing Cu. An oxide film on the surface of the substrate can be removed by the bonding material 2a, which can also be bonded to Cu. Thus, high quality and high reliability of bonding can be obtained.

In addition, according to the present invention, the above preferred embodiments can be arbitrarily combined, or each preferred embodiment can be appropriately varied or omitted within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A method for manufacturing a semiconductor device, comprising:
   (a) disposing, on a substrate, a bonding material cut-out of a sheet using an adsorptive collet and having sinterability;
   (b) disposing a semiconductor element on said bonding material after said (a); and
   (c) sintering said bonding material while applying pressure to said bonding material between said substrate and said semiconductor element,
   wherein said bonding material includes only particles of one of Ag, Au, Pd, Pt, Cu, or other noble metal, and said particles are coated with an organic film.

2. The method for manufacturing a semiconductor device according to claim 1, wherein said bonding material having the sheet shape and having the sinterability has a uniform thickness.

3. The method for manufacturing a semiconductor device according to claim 1, wherein
   said substrate comprises an insulating substrate containing SiN or MN, and
   said insulating substrate has a surface on said semiconductor element side on which a circuit pattern containing Cu is formed.

4. The method for manufacturing a semiconductor device according to claim 1, wherein said substrate comprises a conductive substrate containing Cu.

5. The method for manufacturing a semiconductor device according to claim 1, further comprising (d) cutting out said bonding material from an original bonding material having a sheet shape and having sinterability before said (a), said bonding material having the same size as that of a surface to be subjected to bonding of said semiconductor element,
   wherein said bonding material cut out in said (d) is disposed on said substrate in said (a).

6. A method for manufacturing a semiconductor device, comprising:
   (a) disposing, on a substrate, a bonding material having a sheet shape and having sinterability;
   (b) disposing a semiconductor element on said bonding material after said (a);
   (c) sintering said bonding material while applying pressure to said bonding material between said substrate and said semiconductor element; and
   (d) cutting out said bonding material from an original bonding material having a sheet shape and having sinterability before said (a), said bonding material having the same size as that of a surface to be subjected to bonding of said semiconductor element,
   wherein said bonding material includes particles of Ag or Cu, and said particles are coated with an organic film
   wherein said bonding material cut out in said (d) is disposed on said substrate in said (a), said bonding material is cut out with an adsorptive collet in said (d), and said bonding material cut out with said adsorptive collet is carried and disposed in said (a), and
   said bonding material cut out with said adsorptive collet in said (d) has the same area as that of the surface to be subjected to bonding of said semiconductor element.

7. The method for manufacturing a semiconductor device according to claim 1, wherein said bonding material has cushioning properties and tackiness.

* * * * *